(12) United States Patent
Arnepalli et al.

(10) Patent No.: US 10,163,629 B2
(45) Date of Patent: *Dec. 25, 2018

(54) LOW VAPOR PRESSURE AEROSOL-ASSISTED CVD

(71) Applicant: APPLIED MATERIALS, INC., Santa Clara, CA (US)

(72) Inventors: Ranga Rao Arnepalli, Krishna (IN); Nilesh Chimanrao Bagul, Bangalore (IN); Prerna Sonthalia Goradia, Mumbai (IN); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 270 days.

This patent is subject to a terminal disclaimer.

(21) Appl. No.: 15/045,081

(22) Filed: Feb. 16, 2016

(65) Prior Publication Data

US 2017/0140920 A1   May 18, 2017

Related U.S. Application Data

(60) Provisional application No. 62/255,644, filed on Nov. 16, 2015.

(51) Int. Cl.
*H01L 21/02* (2006.01)
*C23C 16/448* (2006.01)
(Continued)

(52) U.S. Cl.
CPC ........ *H01L 21/0262* (2013.01); *C23C 16/045* (2013.01); *C23C 16/4486* (2013.01);
(Continued)

(58) Field of Classification Search
CPC ................................................. C23C 16/4486
See application file for complete search history.

(56) References Cited

U.S. PATENT DOCUMENTS

| 6,146,767 A | 11/2000 | Schwartz |
| 6,503,701 B1 * | 1/2003 | Bauer .................... B82Y 15/00 |
| | | 435/283.1 |

(Continued)

FOREIGN PATENT DOCUMENTS

| CN | 106967962 A | 7/2017 |
| JP | 2017137564 A | 8/2017 |

OTHER PUBLICATIONS

TW105216345, "Office Action", dated May 1, 2017, 2 pages.
(Continued)

*Primary Examiner* — Dah-Wei D. Yuan
*Assistant Examiner* — Kristen A Dagenais-Englehart
(74) *Attorney, Agent, or Firm* — Kilpatrick Townsend & Stockton LLP

(57) ABSTRACT

Systems and methods for processing films on the surface of a substrate are described. The systems possess aerosol generators which form droplets from a condensed matter (liquid or solid) of one or more precursors. A carrier gas is flowed through the condensed matter and push the droplets toward a substrate placed in a substrate processing region. An inline pump connected with the aerosol generator can also be used to push the droplets towards the substrate. A direct current (DC) electric field is applied between two conducting plates configured to pass the droplets in-between. The size of the droplets is desirably reduced by application of the DC electric field. After passing through the DC electric field, the droplets pass into the substrate processing region and chemically react with the substrate to deposit or etch films.

17 Claims, 5 Drawing Sheets

(51) Int. Cl.
*H01L 21/3065* (2006.01)
*C23C 16/04* (2006.01)
*C23C 16/455* (2006.01)
*H01L 21/306* (2006.01)
*H01L 21/32* (2006.01)
*H01L 21/465* (2006.01)

(52) U.S. Cl.
CPC .... *C23C 16/45525* (2013.01); *H01L 21/0228* (2013.01); *H01L 21/02107* (2013.01); *H01L 21/30621* (2013.01); *H01L 21/32* (2013.01); *H01L 21/465* (2013.01); *H01L 21/02521* (2013.01)

(56) References Cited

U.S. PATENT DOCUMENTS

| | | | |
|---|---|---|---|
| 7,718,011 B2 | 5/2010 | Fishkin et al. | |
| 7,954,730 B2 | 6/2011 | Ng | |
| 8,840,037 B2 | 9/2014 | Stark et al. | |
| 9,677,984 B2 | 6/2017 | Zachariah et al. | |
| 2004/0209190 A1* | 10/2004 | Mori | G03F 7/7075 430/311 |
| 2005/0186339 A1 | 8/2005 | Rajagopalan et al. | |
| 2006/0124057 A1 | 6/2006 | Sasaki | |
| 2007/0194157 A1* | 8/2007 | Golden | B05B 5/025 239/698 |
| 2008/0146011 A1 | 6/2008 | Yoon et al. | |
| 2009/0152371 A1* | 6/2009 | Stark | B05B 5/0255 239/3 |
| 2010/0300221 A1 | 12/2010 | Lee et al. | |
| 2011/0097507 A1 | 4/2011 | Dick et al. | |
| 2011/0163062 A1 | 7/2011 | Gordon et al. | |
| 2011/0198620 A1* | 8/2011 | Han | H05B 33/04 257/88 |
| 2012/0074575 A1 | 3/2012 | Yeom et al. | |
| 2012/0088315 A1 | 4/2012 | Merelle et al. | |
| 2013/0316541 A1 | 11/2013 | Benwadih | |
| 2014/0262461 A1 | 9/2014 | Trainor et al. | |
| 2017/0140920 A1 | 5/2017 | Arnepalli et al. | |

OTHER PUBLICATIONS

Daniel C. Taflin, Timothy L. Ward, and E. James Davis, "Electrified Droplet Fission and the Rayleigh Limit", *Department of Chemical Engineering, BF-IO*, University of Washington, Seattle, Washington 98195; In Final Form: Oct. 17, 1988.
U.S. Appl. No. 15/286,234, "Non-Final Office Action", dated Dec. 28, 2017, 7 pages.
U.S. Appl. No. 15/286,234, "Non-Final Office Action", dated Jul. 11, 2017, 15 pages.
CN201621184367.4, "Office Action", dated May 11, 2017, 1 page.
TW105216345, "Notice of Decision to Grant", dated Jun. 30, 2017.

* cited by examiner

LOW VAPOR PRESSURE AEROSOL-ASSISTED CVD

CROSS-REFERENCES TO RELATED APPLICATIONS

This application claims the benefit of U.S. Prov. Pat. App. No. 62/255,644 filed Nov. 16, 2015, and titled "LOW VAPOR PRESSURE AEROSOL-ASSISTED CVD" by Arnepalli et al., which is hereby incorporated herein in its entirety by reference for all purposes.

FIELD

The embodiments described herein relate to chemical vapor deposition using low vapor pressure precursors.

BACKGROUND

Forming films on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques. CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Chemical precursors have been introduced into a substrate processing region of a substrate processing chamber. A substrate is positioned within the substrate processing region and one or more precursors may be introduced into the substrate processing region to deposit the film. Liquid precursors may be used by "bubbling" a carrier gas through the liquid to carry vapor into the substrate processing region. The effectiveness of this technique is dependent upon the vapor pressure of the liquid. The temperature of the liquid may be increased to increase the vapor pressure. An ultrasonic generator has also been used to generate droplets to increase the delivery of precursors to the substrate processing region, however, the droplet size can negatively impact deposition uniformity and gapfill capabilities.

Methods are needed to decrease the droplet sizes in aerosol-assisted CVD to broaden the available applications which can utilize low vapor pressure precursors.

SUMMARY

Systems and methods for processing films on the surface of a substrate are described. The systems possess aerosol generators which form droplets from a condensed matter (liquid or solid) of one or more precursors. A carrier gas is flowed through the condensed matter and push the droplets toward a substrate placed in a substrate processing region. An inline mechanical pump connected with the aerosol generator can also be used to push the droplets towards the substrate. A direct current (DC) electric field is applied between two conducting plates configured to pass the droplets in-between. The size of the droplets is desirably reduced by application of the DC electric field. After passing through the DC electric field, the droplets pass into the substrate processing region and chemically react with the substrate to deposit or etch films.

Embodiments of the invention include methods of forming a layer on a substrate. The methods include placing the substrate into a substrate processing region of a substrate processing chamber. The methods further include placing a liquid precursor into an aerosol generator. The methods further include flowing a carrier gas into the aerosol generator to produce aerosol droplets. The methods further include applying an electric field to the aerosol droplets. The methods further include flowing the aerosol droplets into the substrate processing region. The methods further include forming the layer on the substrate from the aerosol droplets.

The layer may be one of a II-VI or a III-V semiconductor. The layer may be one of boron nitride, aluminum nitride, gallium arsenide, gallium phosphide, indium arsenide or indium antimonide. The layer may be a metal-oxide and may consist of oxygen and a metal element. The electric field may be a DC electric field having an electric field which points towards the substrate. The methods may further comprise flowing a second precursor into the substrate processing region to form a monolayer on the layer. The electron temperature in the substrate processing region during forming the layer may be below 0.5 eV.

Embodiments of the invention include methods of processing a layer on a substrate. The methods include placing the substrate into a substrate processing region of a substrate processing chamber. The methods further include dissolving a solid precursor into a solvent to form a precursor solution within an aerosol generator. The methods further include flowing a carrier gas into the aerosol generator to produce aerosol droplets. The methods further include applying an electric field to the aerosol droplets. The methods further include flowing the aerosol droplets into the substrate processing region. The methods further include etching the layer on the substrate by chemical reaction with the aerosol droplets.

The layer may consist of only two elements. The layer may consist of a group III element and a group V element. The layer may consist of a group II element and a group VI element. The methods may further comprise flowing a second precursor into the substrate processing region to remove one monolayer from the layer. The electric field may be a DC electric field having an electric field which points towards the substrate. The electric field may have a magnitude between 500 V/cm and 20,000 V/cm. The aerosol droplets may have a diameter between 3 nm and 75 nm. An electron temperature in the substrate processing region during etching the layer may be below 0.5 eV.

Embodiments of the invention include chambers for forming a film on a substrate. The chambers include a heated carrier gas supply. The chambers further include an aerosol generator configured to receive a heated carrier gas from the heated carrier gas supply and configured to produce aerosol droplets from a condensed matter precursor. The chambers further include a precursor conduit configured to receive the aerosol droplets. The chambers further include a DC power supply. The chambers further include a top electrode and a bottom electrode configured to receive the aerosol droplets and receive a differential voltage from the DC power supply by way of vacuum electrical feedthroughs. The differential voltage is applied between the top electrode and the bottom electrode to reduce a size of the aerosol droplets. The chambers further include a substrate pedestal disposed within a substrate processing region within the chamber. The substrate pedestal is configured to support the substrate during processing of the film.

The differential voltage may be between 100 volts and 2 kvolts. The electric field formed by applying the differential voltage may have a magnitude between 500 V/cm and 20,000 V/cm. The aerosol droplets may have a diameter between 3 nm and 75 nm.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

Figure 1:
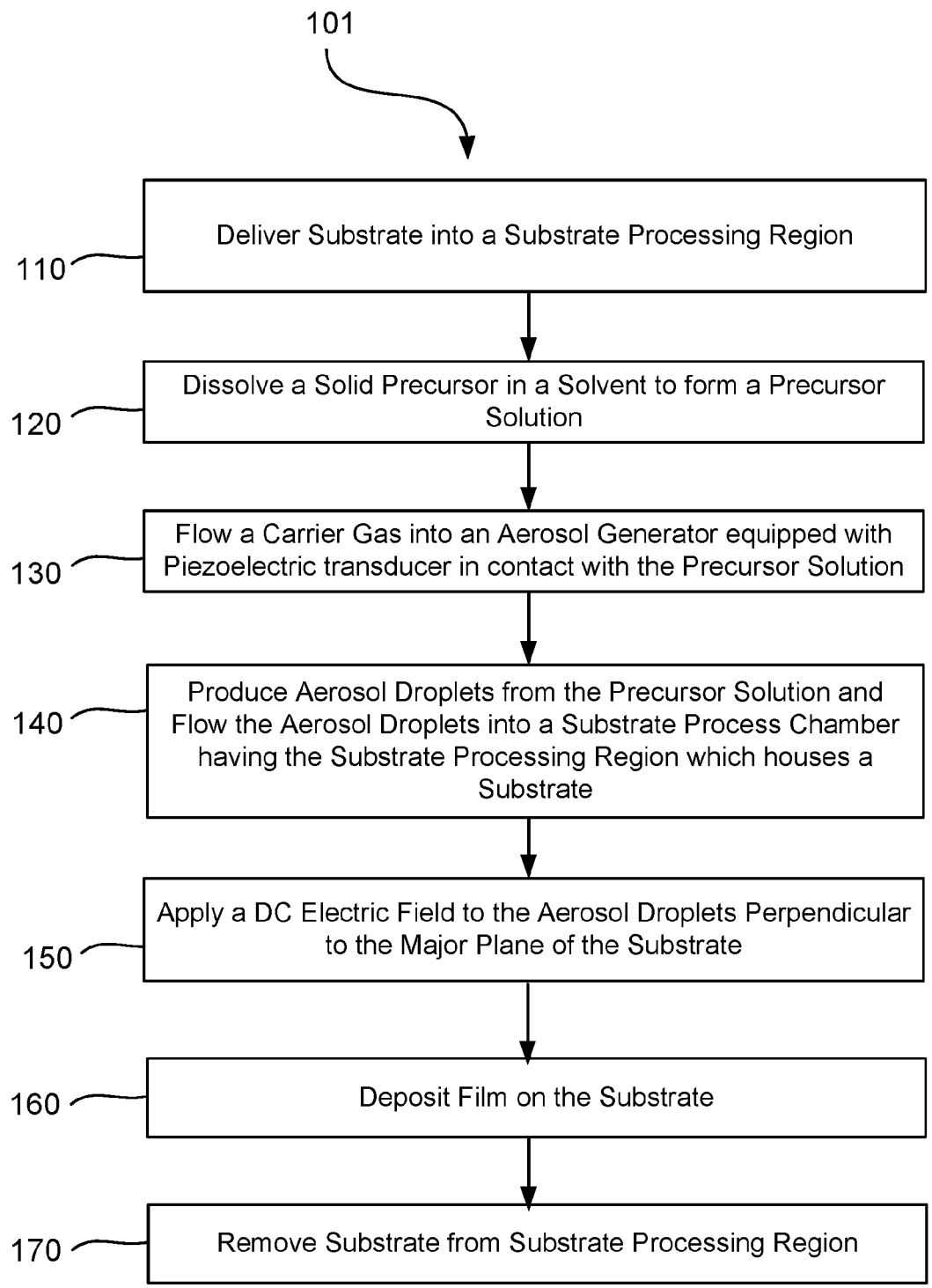
FIG. 1 is a flow chart of a film formation process according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Systems and methods for processing films on the surface of a substrate are described. The systems possess aerosol generators which form droplets from a condensed matter (liquid or solid) of one or more precursors. A carrier gas is flowed through the condensed matter and push the droplets toward a substrate placed in a substrate processing region. An inline mechanical pump connected with the aerosol generator can also be used to push the droplets towards the substrate. A direct current (DC) electric field is applied between two conducting plates configured to pass the droplets in-between. The size of the droplets is desirably reduced by application of the DC electric field. After passing through the DC electric field, the droplets pass into the substrate processing region and chemically react with the substrate to deposit or etch films.

There is a desire to broaden the suite of available chemical precursors which may be used in, for example, CVD, atomic layer etching (ALEt), and atomic layer deposition (ALD) chambers. Low vapor pressure solid precursors and high boiling-point liquid precursors have been difficult to deliver in the vapor phase into the CVD, ALEt or ALD chambers. This has limited the usage of precursor for thin film material deposition. Improving the delivery of solid and low vapor pressure liquids into processing chambers may particularly improve the deposition of films containing more than one element. Self-Assembled Monolayers (SAM) may particularly benefit from the use of low vapor pressure precursors. Semiconductor film formation applications benefit from dry deposition processes (vapor phase) over liquid depositions processes.

The embodiments described herein may involve a solid precursor and/or a liquid precursor having low vapor pressure. Liquids and solids (or the combination) may generally be described as condensed matter. Condensed matter consists of atoms/molecules which are constantly under the influence of the forces imparted by neighboring atoms/molecules and may be defined as matter having essentially no or no mean free path according to embodiments. A solid precursor having low vapor pressure may be dissolved in a single solvent or mixture of compatible solvents, in embodiments, and the combination may be referred to as condensed matter. An aerosol is formed from the condensed matter and may be formed using an ultrasonic humidifier. The ultrasonic humidifier may have a piezoelectric transducer that can be operated at one or more frequencies. The ultrasonic humidifier may generate aerosol droplets which are carried into the reaction chamber (substrate processing region) using a carrier gas such as nitrogen ($N_2$) or argon (Ar). The carrier gas may be inert and not form covalent chemical bonds with the condensed matter nor with the substrate. An inline mechanical pump connected with the aerosol generator can also be used to push the droplets towards the substrate.

The aerosol droplets may pass through conduit(s) which are heated to prevent condensation or to promote reaction with a substrate after the aerosol droplets enter the substrate processing region. The substrate processing region resides within a substrate processing chamber and is a vacuum chamber which is evacuated of atmospheric gases prior to delivery of precursors into the substrate processing region. The substrate processing region is sealed from the external atmosphere and may be operated at much lower than atmospheric pressure to evacuate the atmospheric gases in embodiments. The condensed matter precursors do not need to be volatile to generate the aerosol droplets. The condensed matter precursors may be soluble in a solvent or mixture of solvents from which aerosol droplets are generated. As a result of the embodiments described herein, a wider range of precursors may now be used since volatility is no longer necessary. The substrate processing chamber may also be configured with two electrodes which can generate an electric field. The electric field has been found to desirably reduce the size of or maintain the small size of aerosol droplets.

Figure 2:
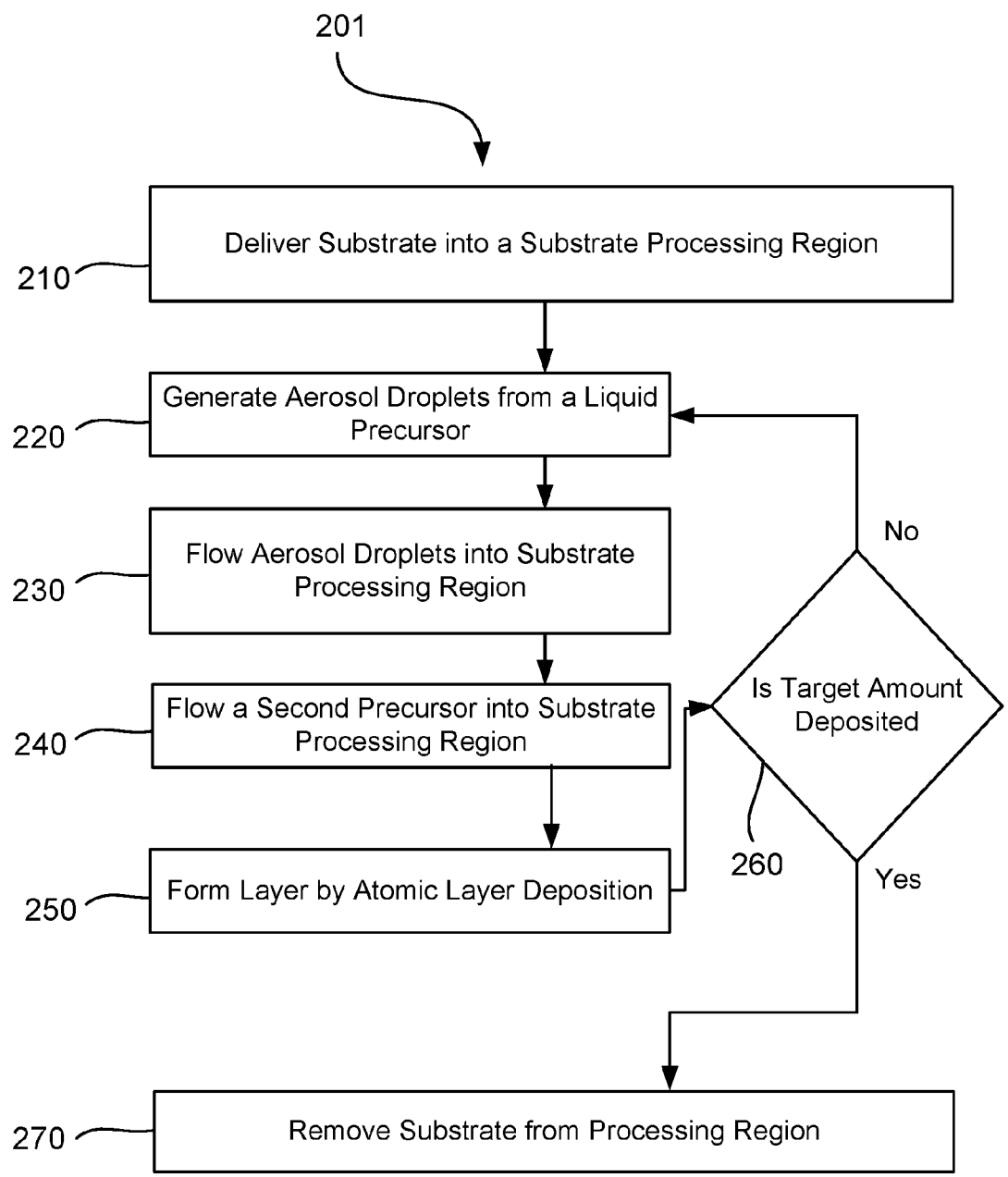
FIG. 2 is a flow chart of a film formation process according to embodiments.

To better understand and appreciate the embodiments described herein, reference is now made to FIGS. 1-2 which are flow charts of film formation processes (101 and 201) according to embodiments. Concurrent reference will be made to FIG. 3-4 which include a schematic cross-sectional view of a substrate processing chamber 1001 and substrate processing system 1101 according to embodiments. In process 101, the substrate 1013 is delivered into substrate processing region of substrate processing chamber 1001 in operation 110. Substrate 1013 is supported by substrate pedestal 1014 which may resistively heated and/or cooled by passing a thermally controlled liquid through substrate pedestal 1014. A portion of substrate pedestal and all of substrate 1013 are shown inside the substrate processing region. The substrate processing region is otherwise bounded by quartz baffle 1012 and quartz housing 1016 which may be included to beneficially reduce the temperature of chamber body 1006 in the course of film formation.

A solid precursor is dissolved in a solvent in operation 120 and placed in an aerosol generator 1003-1 with a piezoelectric transducer 1004-1. A carrier gas is heated in heated carrier gas supply 1002 and flowed into aerosol generator 1003-1 in operation 130. Piezoelectric transducer 1004-1 is vibrated by applying an oscillating voltage to the top and bottom of the transducer and aerosol droplets are generated from the precursor solution in aerosol generator 1003-1 (operation 140). Also in operation 140, the aerosol droplets flow through precursor conduit 1015-1 and enter substrate processing chamber 1001 through top lid 1005. The aerosol droplets also flow through top electrode 1009 and then through bottom electrode 1010 before entering the substrate processing region housing substrate 1013. A DC electric field is applied between top electrode 1009 and bottom electrode 1010 while aerosol droplets pass between the two electrodes (operation 150). The electric field is applied in electric field region 1011 and points from top electrode 1009 towards bottom electrode 1010. Insulator 1008 is configured to maintain electrical separation between top electrode 1009 and bottom electrode 1010. Chamber body 1006 and top lid 1005 may also be electrically insulated from one or both of top electrode 1009 and bottom electrode 1010 in embodiments. The DC voltage difference is generated within DC power supply 1007 and passes into the substrate processing region by way of vacuum compatible electrical feedthroughs. The small size of the aerosol droplets is reduced or maintained, in embodiments, through application of the DC electric field which is perpendicular to the major plane of substrate 1013. Top electrode 1009 and bottom electrode 1010 have perforations which allow the aerosol droplets to pass through both but are otherwise planar and each are parallel to the major plane of substrate 1013. The substrate can also be electrically biased during the deposition. A film is deposited on substrate 1013 from the aerosol droplets in operation 160 and the substrate is removed from the substrate processing region in operation 170.

Aerosol generators 1003 may be positioned close to substrate processing chamber 1001 to further maintain small aerosol droplet sizes. The volume within Aerosol generators 1003 may be roughly proportional to the area of the substrate to be processed. For example, a one liter aerosol generator 1003 may be used to create aerosol droplets for a 300 mm substrate. A mass flow controller may be used to control flow rate of aerosol droplets within precursor conduit 1015-1 towards substrate processing chamber 1001. Precursor conduit 1015-1 may contain heated activated charcoal to maintain elevated temperature (above room temperature) of the aerosol droplets which also helps to maintain small aerosol droplet sizes.

A solid precursor was used for film formation process 101. A solid or liquid precursor may have been used, in embodiments, and the solid precursor was exemplary to show the effectiveness of the technique at accommodating low vapor pressure precursors. In the next example, a liquid precursor is used but a solid precursor may replace the liquid precursor in embodiments. A substrate is placed within a substrate processing region in operation 210.

A liquid precursor is placed in an aerosol generator 1003-2 having an embedded transducer 1004-2. A carrier gas is heated in heated carrier gas supply 1002 and flowed into aerosol generator 1003-2. Transducer 1004-2 is vibrated by applying an oscillating voltage to the top and bottom of the transducer and aerosol droplets are generated from the precursor solution in aerosol generator 1003-2 (operation 220). The liquid precursor may also be dissolved in a solvent or combination of compatible solvents, according to embodiments, as was the case for the solid precursor of the first example. The aerosol droplets then flow through precursor conduit 1015-2 and enter substrate processing chamber 1001 through top lid 1005. The aerosol droplets then flow through top electrode 1009 and through bottom electrode 1010 before entering the substrate processing region housing substrate 1013 in operation 230. Prior to entering the substrate processing region, a DC electric field is applied between top electrode 1009 and bottom electrode 1010 while aerosol droplets pass between the two electrodes. The electric field is applied in electric field region 1011 and points from top electrode 1009 towards bottom electrode 1010. Insulator 1008 is configured to maintain electrical separation between top electrode 1009 and bottom electrode 1010. The DC voltage difference is generated within DC power supply 1007 and passes into the substrate processing region by way of vacuum compatible electrical feedthroughs. The small size of the aerosol droplets is reduced or maintained, in embodiments, through application of the DC electric field which is perpendicular to the major plane of substrate 1013. Top electrode 1009 and bottom electrode 1010 have one or more perforations which allow the aerosol droplets to pass through both but are otherwise planar and each are parallel to the major plane of substrate 1013. The pedestal may be electrically biased relative to chamber body 1006, top electrode 1009 and/or bottom electrode 1010 in embodiments.

A thin film is deposited on substrate 1013 from the small aerosol droplets. The substrate processing region may be evacuated to remove unreacted aerosol droplets and reaction by-products. A second precursor with distinct chemical characteristics is then flowed into the substrate processing region (operation 240) to complete the formation of an "atomic" layer deposition film (ALD) in operation 250. The process may be repeated if the target thickness has not been achieved (operation 260). Once the target thickness is achieved, the substrate is removed from the substrate processing region in operation 270. Generally speaking, the precursors can be delivered to the substrate processing region in a sequential, alternating manner as in the example or they may enter the reactor concurrently according to embodiments. The precursors may be combined with one another prior to entering the substrate processing region in embodiments.

Benefits of the processes and equipment described herein may relate to a reduction in processing time. Film formation using low vapor precursors have been found to often require hours and even tens of hours to attain beneficial film thicknesses. The techniques and hardware described herein may be used to reduce film etching/formation times by a factor of over one hundred to over a thousand according to embodiments. Etching/Deposition times may be between five seconds and five minutes or between fifteen seconds and two minutes in embodiments. The vapor etching or vapor deposition techniques described herein are a "dry" process in that the reactions are dominated by gas-surface chemical reactions. Some prior art process involve dipping a patterned substrate into a liquid solution containing a low vapor pressure precursor to attain desirable etch or deposition rates. The precursors are delivered to the substrate in the gas-phase herein, and the processes may therefore be described as dry processes. The dry processes described herein avoid the damage which may occur to small linewidth patterned substrates as a consequence of the surface tension of liquid processing. A benefit of the dry processes and equipment include achievement of high etching/deposition rates while avoiding pattern collapse.

In all embodiments described herein, the precursors are in a condensed matter phase which may include being dissolved in a solvent. The vapor pressure of the condensed matter precursor may be zero, immeasurably low, below 10 Torr, below 20 Torr or below 30 Torr prior to dissolution (or if a solvent is not used at all) in embodiments. The vapor pressure of a solution containing the condensed matter precursor and a suitable solvent may be 10 Torr, below 30 Torr or below 50 Torr following dissolution, according to embodiments. Exemplary condensed matter precursors will be presented after introducing a motivating deposition application.

An exemplary deposition application which may benefit from the techniques and hardware described herein is the formation of self-assembled monolayers, which may involve the use of low vapor pressure liquid precursors. A benefit of the deposition processes described herein is the exceedingly conformal deposition rate on finely and intricately patterned substrates. Deep gaps, trenches or vias often exhibit a higher deposition rate near their opening relative to portions deep within a trench especially when droplet sizes are large compared to the feature sizes or linewidths. The methods described herein may be used to deposit conformal films having a uniform or relatively uniform thickness of between 0.5 nm and 20 nm, between 1 nm and 10 nm or between 2 nm and 5 nm according to embodiments. The methods may alternatively be used to etch at a uniform etch rate despite intricate patterning on a patterned substrate. The widths and depths of a via or trench (features) may be between 3 nm and 20 nm or between 5 nm and 10 nm in embodiments. All parameters described herein may apply to both etching and deposition but the illustrative examples describe deposition processes. The width of via or trench (in the narrower dimension) may be less than 30 nm, less than 20 nm or less than 10 nm in embodiments. Depths are measured herein from the top to the bottom of a trench. "Top", "above" and "up" will be used herein to describe portions/directions perpendicularly distal from the substrate plane and further away from the major plane of the substrate in the perpendicular direction. "Vertical" will be used to describe items aligned in the "up" direction towards the "top". Other similar terms may be used whose meanings will now be clear.

Exemplary low vapor pressure precursors include precursors which may be used to form self-assembled monolayers (SAMs). The techniques described herein may be used for many more than those presented below but illustrative examples may aid in understanding the embodiments disclosed herein. The precursors used to deposit self-assembled monolayers may have tail moieties (TM) chemically distinct from head moieties (HM) which have been found to be conducive to the formation of self-assembled monolayers. The precursors may be a phosphonic acid which include a HM having chemical formula $PO(OH)_2$. The low vapor pressure condensed matter precursors may include one or more of octylphosphonic acid $(CH_3(CH_2)_6CH_2$—$P(O)(OH)_2)$, perfluorooctylphosphonic acid $(CF_3(CF_2)_5CH_2$—$CH_2$—$P(O)(OH)_2)$, octadecylphosphonic acid $(CH_3(CH_2)_{16}CH_2$—$P(O)(OH)_2)$, decyl phosphonic acid, mesityl phosphonic acid, cyclohexyl phosphonic acid, hexyl phosphonic acid or butyl phosphonic acid according to embodiments.

The tail moiety (TM) may prevent or discourage film formation on the patterned layer during subsequent exposure to a second deposition precursor. The tail moiety of a phosphonic acid precursor may include a perfluorinated alkyl group having more than 5 carbon atoms, more than 6 carbon atoms or more than 7 carbon atoms covalently bonded to one another in a chain according to embodiments. The presence of the larger fluorine atoms in lieu of the much smaller hydrogen atoms appears to discourage nucleation of the patterned layer for smaller carbon chains. The tail moiety of the a phosphonic acid precursor may include an alkyl group having more than 12 carbon atoms, more than 14 carbon atoms, or more than 16 carbon atoms, covalently bonded in a chain in embodiments. The TM may comprise linear or aromatic hydrocarbons, such as —$CH_2$, $C_6H_5$, $C_6H_4$, $C_2H_5$, or —$CH_2CH_2CH_3$ according to embodiments.

The precursors used to deposit a self-assembled monolayer (SAM) may provide a head moiety which bonds covalently to the substrate and a tail moiety which extends from the covalent bond away from the substrate. The tail moiety includes a relatively long covalently-bonded sequence referred as a chain. The SAM may be stable (resist decomposition) up to 300° C. or 350° C. substrate temperatures in embodiments. The HM of the chemical precursor molecule may contain a sulfur-containing group such as a thiol group. The precursor may be one or more of methanethiol ($CH_3SH$), ethanethiol ($C_2H_5SH$), or butanethiol ($C_4H_9SH$), N-alkanethiols $\{CH_3(CH_2)_{n-1}SH$ where n is 8, 12, 16, 18, 20, 22, or 29$\}$ according to embodiments. The precursor may be one or more of $CF_3$ and $CF_2$ terminated thiols, such as $CF_3(CF_2)_n(CH_2)_{11})SH$ and $CF_3(CF_2)_9(CH_2)_nSH$ (where n is 2, 11, or 17), and $(CF_3(CH_2)_nSH)$ where n is 9-15 in embodiments. The head group may contain a nitrogen containing group according to embodiments. The precursor may be one or more of 3-aminopropyltriethoxysilane (APTES), (3-Aminopropyl)trimethoxysilane (APTMS), 1,3 diamino propane, ethylenediamine, ethylenediaminetetraacetic acid, diethylamine and methylamine in embodiments.

The deposition rate of a film onto the patterned layer over the SAM may be much less than the deposition rate of the film over a portion which is not covered by the self-assembled monolayer. The deposition rate of the film over the SAM may be reduced by the presence of the SAM and the deposition rate may be much less than if the SAM were not present. In embodiments, the deposition rate over SAM-free portions may be more than one hundred times, more than one hundred fifty times or more than two hundred times the growth rate over SAM portions. The presence or absence of the SAM layer may be determined by a difference in affinity of the low vapor pressure precursor to different exposed portions on the patterned substrate. For example, a deposition rate of SAM may proceed readily over an exposed metal portion but not over an exposed dielectric portion of a patterned substrate. The metal portion may be electrically conductive and may comprise or consist of an element which forms conducting material in a condensed matter state if no other elements are present. The deposition rate of the SAM layer on the exposed metal portion may exceed the deposition rate on the exposed dielectric portion by a multiplicative factor of 10, 15, 20 or 25 in embodiments.

In embodiments, the precursors may deposit on both two or more chemically distinct portions of the patterned layer but may form covalent bonds on only one of the two portions. On the other portion the precursors may bond by physisorption meaning no covalent bonds are formed between the precursors and the second exposed surface portion. In this scenario, the physisorbed precursors may be removed easily while allowing the chemisorbed (covalently bonded) precursors to stay. This is an alternative method for producing a selectively-deposited SAM layer.

Figure 3A:
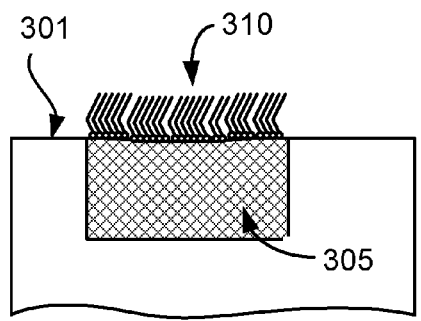
FIGS. 3A, 3B and 3C are side views of a patterned substrate at points during and following selective deposition of a self-assembled monolayer according to embodiments.
Figure 3B:
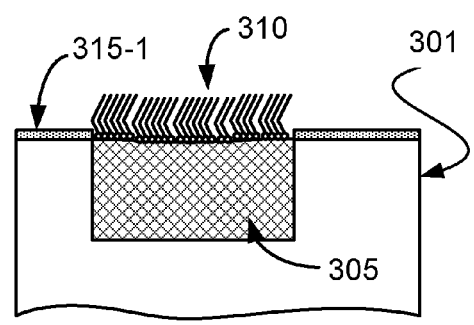
Figure 3C:
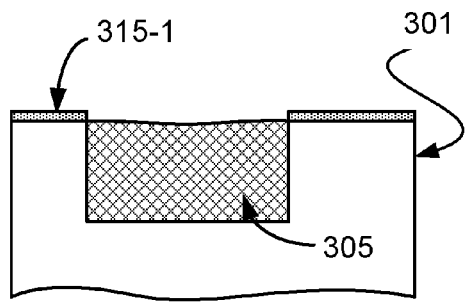

A self-assembled monolayer (SAM) as grown herein may be selectively deposited on some portions of a patterned substrate but not on others. A subsequent deposition may then proceed only on regions without a SAM coating. The methods described herein may provide cost savings and increased overlay accuracy compared to traditional methods which involve lithographic patterning. Following the SAM selective deposition, the subsequent deposition may also be referred to as a selective deposition but is the reverse image of the selectively deposited SAM layer. The subsequently deposited film may have a greater utility (compared to SAM) in the functioning of the completed integrated circuit or in further processing. FIGS. 3A, 3B and 3C are side views of a patterned substrate at points during and following selective deposition of a self-assembled monolayer 310 and a selectively deposited dielectric 315-1. In FIG. 3A, self-assembled monolayer 310 is deposited on exposed copper 305 in a gap within patterned substrate 301 but not on other exposed portions. exposed copper 305 may be bare, i.e. may have no liner layer or barrier layer between the top of copper 305 and self-assembled monolayer 310.

Figure 3D:
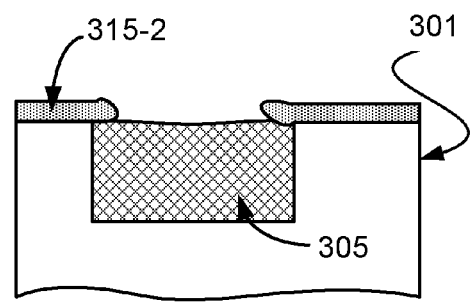
FIG. 3D is a side view of a patterned substrate following selective deposition of a self-assembled monolayer without the embodiments disclosed herein.

FIG. 3B shows a selectively deposited dielectric 315-1 which forms in locations which have no self-assembled monolayer, namely anyplace which is not copper in the example. Self-assembled monolayer 310 may be removed to leave selectively deposited dielectric 315-1 everywhere except the inlaid copper 305 in the gaps of patterned substrate 301 as shown in FIG. 3C. FIG. 3D is a side view of a patterned substrate following selective deposition of a self-assembled monolayer without the embodiments disclosed herein. Prior art methods of forming self-assembled monolayers have been tested with the process flow of FIGS. 3A-3C and tend to produce selectively deposited dielectric 315-2 which covers up portions of inlaid copper 305 and increases resistivity within or results in failure of completed devices.

Exemplary solvents which may be used to dissolve the low vapor pressure condensed matter precursor may include one or more of isopropyl alcohol (IPA), 1-butanol, toluene, xylene, benzene, hexane, cyclohexane, tetrahydrofuran, dimethyl sulfoxide, dimethylformamide, acetonitrile, dichloromethane, ethyl acetate and chloroform according to embodiments. The solvent may comprise an aromatic hydrocarbon, may comprise or consist of carbon and hydrogen, or may comprise or consist of carbon, hydrogen and oxygen in embodiments.

The substrate temperature may be elevated above room temperature during deposition depending on the type of film grown. The dry processes introduced herein enable the processes to be performed at higher temperatures than prior art liquid processes. The small aerosol droplets may exit the holes of quartz baffle 1012, then approach and contact substrate 1013 while the substrate is maintained at a temperature between 100° C. and 800° C., between 200° C. and 700° C., between 300° C. and 600° C., or between 400° C. and 500° C. These substrate temperatures all deposition operations described herein. Chamber body 1006 and/or top lid 1005 may be stainless steel (e.g. SST 304 or preferably SST 316) material which can withstand relatively high temperatures (perhaps up to 400° C.) with while maintaining vacuum integrity between the substrate processing region inside quartz baffle 1012/quartz housing 1016 and the atmosphere outside chamber body 1006 and top lid 1005. Chamber body 1006, top lid 1005 and any other components may be sealed with O-rings which are compatible with the particular process environment to ensure gas isolation between the substrate processing region and the atmosphere outside substrate processing chamber 1001.

Chamber body 1006 and/or top lid 1005 may be cooled by flowing a coolant through coolant channels machined or formed through e.g. the stainless steel. Coolant channels may be provided near the O-ring connections to protect the O-rings from exposure to high temperatures. Temperatures of top lid 1005 and/or chamber body 1006 may remain below 70° C. during film formation for safety or a reduction in base pressure within quartz baffle 1012 and quartz housing 1016 (the substrate processing region). The presence of the quartz baffle 1012 and quartz housing 1016 may further facilitate the reduction in operational temperature of top lid 1005 and/or chamber body 1006. Quartz baffle 1012 (e.g. the quartz portion with the apertures), top electrode 1009, and/or bottom electrode 1010 may remain below 100° C. during film formation. Substrate pedestal 1014 may be heated to the desired temperatures of substrate 1013 given previously and maintain the temperature of substrate 1013 at a level that assists the process. Substrate pedestal 1014 may be vertically adjustable to provide flexibility in positioning substrate 1013 relative to the bottom of quartz baffle 1012. Thermocouples may be attached to or embedded within top lid 1005 and/or chamber body 1006 to provide feedback control of temperature and/or coolant flow rate. The thermocouples may also be used to shut down precursor flow rate and also shut down heat to substrate pedestal 1014 if an upper safety temperature set point is exceeded.

The pressure in the substrate processing region during the deposition processes described herein may be between 10 Torr and 750 Torr, between 20 Torr and 700 Torr or between 100 Torr and 600 Torr in embodiments. The reactions may proceed thermally, excited only by the temperature of the substrate itself, according to embodiments. In embodiments which rely on the temperature of the substrate to effect the deposition reaction, the term "plasma-free" may be used herein to describe the substrate processing region during application using no or essentially no plasma power. Lack of plasma in the substrate processing region will be quantified in several complementary ways which may be used separately or combined. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in embodiments.

Absence (or reduction in magnitude) of any local plasma is desirable to make deposition processes more conformal and less likely to deform features. The term "plasma-free" will be used herein to describe the substrate processing region during application of no or essentially no plasma power to the substrate processing region. Stated another way, the electron temperature in the substrate processing region may be less than 0.5 eV, less than 0.45 eV, less than 0.4 eV, or less than 0.35 eV according to embodiments. The low vapor pressure precursor is not excited in any remote plasma prior to entering the substrate processing region in embodiments. For example, if a remote plasma region or a separate chamber region is present and used to conduct the aerosol droplets toward the substrate processing region and any remote region(s) may be plasma-free as defined herein.

A gap (shown as electric field region 1011 in FIG. 3) exists between top electrode 1009 and bottom electrode 1010. The gap forming electric field region 1011 is measured between the top surface of bottom electrode 1010 and the bottom surface of top electrode 1009. The height of electric field region 1011 may be between 0.5 mm and 10 mm or between 1 mm and 3 mm according to embodiments. The voltage applied between top electrode 1009 and bottom electrode 1010 to maintain or achieve small aerosol droplet sizes may be a DC voltage placing top electrode 1009 at a positive potential relative to bottom electrode 1010 or bottom electrode 1010 at a positive potential relative to top electrode 1009 in embodiments. The magnitude of the DC voltage difference may be between 100 volts and 2 kvolts, between 200 volts and 1,000 volts or between 500 volts and 800 volts according to embodiments. The DC electric field between top electrode 1009 and bottom electrode 1010 may have a magnitude between 500 V/cm and 20,000 V/cm, between 1,000 V/cm and 10,000 V/cm, or between 2,000 V/cm and 7,000 V/cm in embodiments. Small diameter droplets have been found to be decreased or their size maintained by application of the DC electric field even in cases where the aerosol droplets and uncharged and non-polar according to embodiments.

Additional benefits of the hardware and processes described herein can now be described. Prior art aerosol droplets have had diameters between about 0.5 μm and several μms. Several problems arise from having large diameter droplets delivering the precursors to the substrate. The aerosol droplets formed herein may have a diameter between 3 nm and 75 nm, between 5 nm and 50 nm or between 10 nm and 25 nm according to embodiments. Small aerosol droplet dimensions facilitate penetration of the precursor sources into smaller features on a patterned substrate. The smaller sizes may result in enhanced material gapfill and fewer trapped voids within gaps. The smaller sizes may also enable more conformal deposition as a result of the ability to penetrate the narrow gaps. Aerosol droplets have smaller size also increase the surface to volume ratio which enables more rapid release of elements present in the low vapor pressure precursor (and solvent when used). Some elements are not desirable in the deposited film. The smaller droplet sizes described herein enable undesirable elements (e.g. carbon or hydrogen) to form volatile species which readily leave the surface during the deposition reaction. Additional benefits include reduced surface roughness as well as a reduction in number and size of grain boundaries by using the techniques described herein.

Small aerosol droplets may be initiated using ultrasonic agitation in aerosol generators 1003. As discussed, the size of the aerosol droplets may be reduced (or their growth arrested) by applying a DC electric field in electric field region 1011 before the aerosol droplets pass into the substrate processing region. A particle filter 1019 may be installed downstream from the aerosol generators 1003 to further decrease the sizes of aerosol droplets allowed to pass through precursor conduits 1015, through electric field region 1011 and into the substrate processing region. Particle filter 1019 may allow aerosol droplets having a diameter less than 0.3 μm, less than 0.25 μm or less than 0.2 μm to pass through while inhibiting or arresting the flow of droplets having diameters larger than these size thresholds according to embodiments. The filter may be placed anywhere along precursor conduits 1015, including just above top electrode 1009. The filter may be located in top electrode 1009, in electric field region 1011, in bottom electrode 1010 or even downstream of bottom electrode 1010 in embodiments. Sizes of the aerosol droplets may be measured using an in-situ particle size analyzers (such as a condensation particle counter or detector).

The substrate processing region within substrate processing chamber 1001 may be evacuated using vacuum pump 1017 prior to introducing aerosol droplets into the substrate processing region during all deposition operations described herein. Some chemicals may require further processing after passing through vacuum pump 1017 prior to being released into the atmosphere. A scrubber 1018 may be placed downstream from vacuum pump 1017 to modify or remove chemical constituents of the process effluents before releasing the process effluents. A closed-loop exhaust feedback system may be used to maintain a desired pressure within the substrate processing region. In the event of a pressure within the substrate processing region measuring above a set point pressure (an overpressure situation), an automatic valve (not shown) may release the pressure inside substrate processing chamber 1001 opening the substrate processing region to vacuum pump 1017 and scrubber 1018.

The equipment and techniques described herein may be useful for etching or forming a variety of layers including metals, semiconductors and insulators. The layers may be conformal and may be self-assembled monolayers (SAM) formed from organic or inorganic molecules or atomic layer deposited (ALD) according to embodiments. Purely as illustrative examples, films which may be etched or deposited using these techniques include indium gallium arsenide, indium gallium phosphide, gallium arsenide and titanium oxide. The films may be metal oxides, III-V semiconductors or II-VI semiconductors in embodiments.

FIG. 3 shows two aerosol generators (1003-1 and 1003-2) for delivering low vapor pressure precursors into the substrate processing region. More than two aerosol generators may be present and they may be augmented by non-aerosol generating sources which are not shown in the drawing to increase readability. The transducers in one or more of the aerosol generators may alternatively be left off to provide a non-aerosol generating source with the hardware shown. During film growth one or more of the aerosol generating sources may be used to deliver dopant(s) to the film as may be useful in the case of growing a semiconductor doped with an electrictronic acceptor or donor. In this way, an n-type or p-type semiconductor (e.g. silicon) may be formed using the techniques and hardware described herein.

The examples discussed so far use low vapor pressure precursors to deposit films on a substrate through alternating exposure or continuous exposure. The techniques described herein may also be used to perform etching by alternating or continuous exposure through exposure to an etching precursor (an etchant) which possesses a low vapor pressure. The low vapor pressure etchant may be a halogen-containing precursor, a fluorine-containing precursor, a chlorine-containing precursor or a bromine-containing precursor in embodiments. The low vapor pressure etchant may be a metal-and-halogen-containing precursor wherein the halogen may be fluorine, chlorine or bromine according to embodiments. Analogously, the low vapor pressure etchant may be a halon (e.g. a haloalkane) in embodiments. The low vapor pressure etchant may possess a long alkyl chain as described elsewhere herein which is associated with the low vapor pressures remedied by the techniques presented herein.

The processes described herein may involve the removal of a monolayer for each alternating exposure to a first precursor and a second precursor in embodiments. The processes described herein may involve the deposition of a monolayer of material for each alternating exposure to a first precursor and a second precursor according to embodiments. The first precursor and the second precursor may both be low vapor pressure precursors prepared with aerosol generating techniques. Alternatively, one of the precursors may be a low vapor pressure precursors may be prepared using the aerosol generating techniques and the other may be possess a relatively high vapor pressure and be delivered to the substrate processing region by simpler traditional means.

In all embodiments described herein, the low vapor pressure condensed matter precursor (e.g. the solid precursor or the liquid precursor) may be supplied at a flow rate of between 5 mgm (milligrams per minute) and 500 mgm, between 10 mgm and 300 mgm or between 25 mgm and 200 mgm. Two or more low vapor pressure condensed matter precursor may be used in which case each one may have a flow rate between the ranges given above. Other types of precursors may also be used as may be the case for atomic layer deposition. The other precursor may be supplied at a flow rate of between 5 sccm and 2,000 sccm, between 10 sccm and 1,000 sccm or between 25 sccm and 700 sccm in any of the embodiments described herein. Film growth rates using the aerosol droplet generation methods and hardware described herein may exceed 300 Å/min, may exceed 500 Å/min or may exceed 1,000 Å/min, in embodiments, in contrast to the slow deposition rate of prior art aerosol-assisted chemical vapor deposition.

Each of the embodiments described may possess evacuation operations between sequential alternating exposures during the atomic layer deposition processes. Generally speaking, the deposition and etching operations of all processes described herein may instead simply have a stoppage in the flow of precursors into the substrate processing region during alternating exposure deposition sequences. Alternatively, the substrate processing region may be actively purged using a gas which displays essentially no chemical reactivity to the exposed materials on the patterned substrate. After the precursor stoppage or the active purging, the next precursor may be flowed into the substrate processing region to continue the etching/deposition of/onto the patterned substrate.

A metal may comprise or consist of a "metal element" which forms a conducting material in a solid consisting only of that metal element. The conducting material consisting only of the one metal element (or the metal in relatively pure form) may have a conductivity less than 10-5 Ω-m at 20° C. in embodiments. The conducting material may form ohmic contacts when joined with another conducting material according to embodiments. A metal region as described herein may consist of metal element(s) or may also be a metal nitride since nitrogen has a low electronegativity typically allows metal nitride to maintain electrical conductivity. A metal nitride may comprise a metal element and nitrogen and may consist of a metal element and nitrogen in embodiments. In an exemplary case of tungsten and tungsten nitride, the metal may comprise or consist of tungsten and the metal nitride may comprise or consist of tungsten and nitrogen.

An advantage and benefit of the processes described herein lies in the conformal rate of etching or deposition of materials on the substrate. As used herein, terms such as conformal etching, conformal deposition and conformal film refer to films or removal rates which conform to the contours of a patterned surface regardless of the shape of the surface. The top and bottom surfaces of the removal rate or deposited layer may be generally parallel. A person having ordinary skill in the art will recognize that the deposition process likely cannot be 100% conformal and thus the term "generally" allows for acceptable tolerances. Similarly, a conformal layer refers to a layer having generally uniform thickness. A conformal layer may have an outer surface in the same shape as the inner surface.

Figure 4:
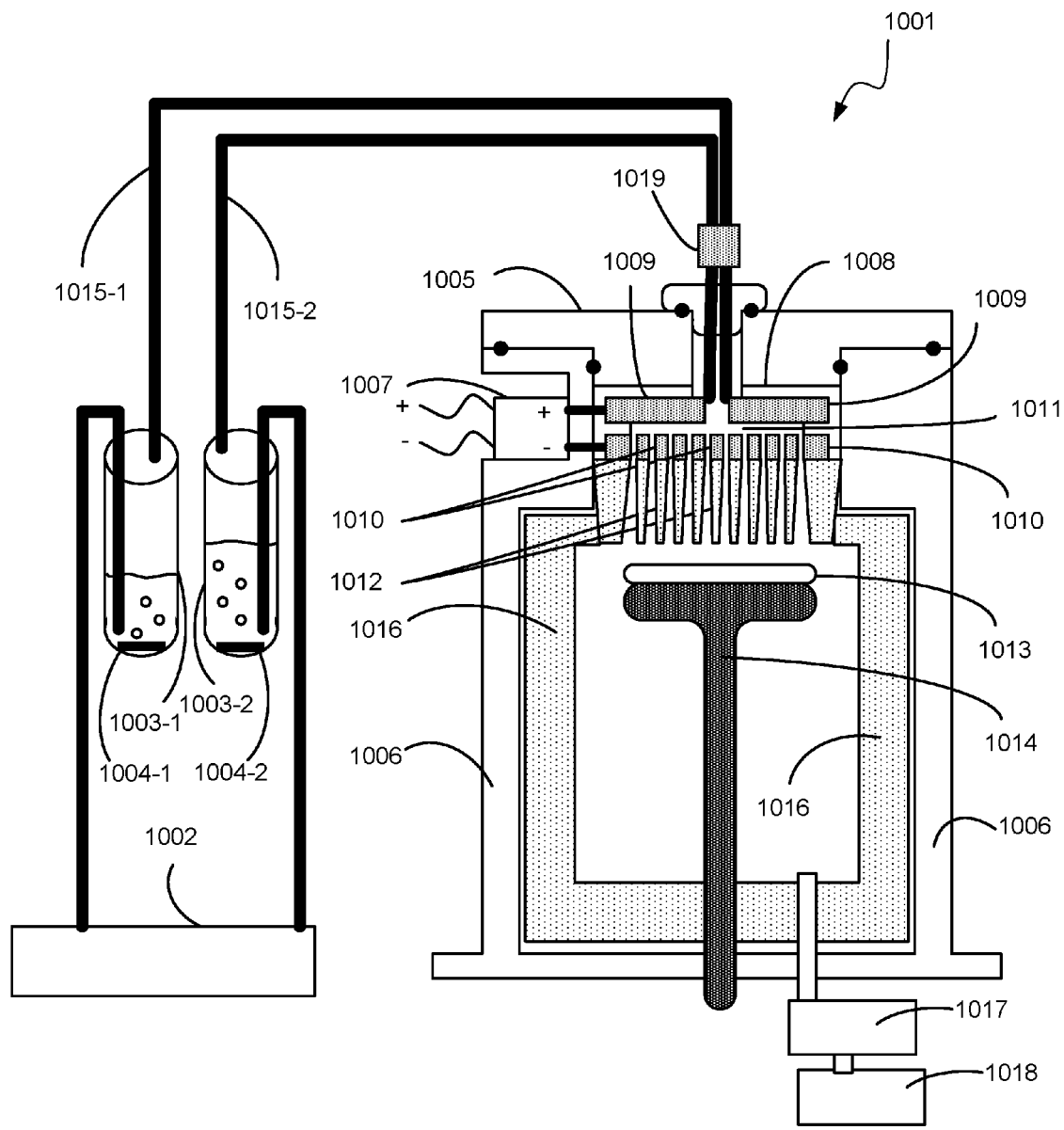
FIG. 4 shows a schematic cross-sectional view of a substrate processing chamber according to embodiments.
Figure 5:
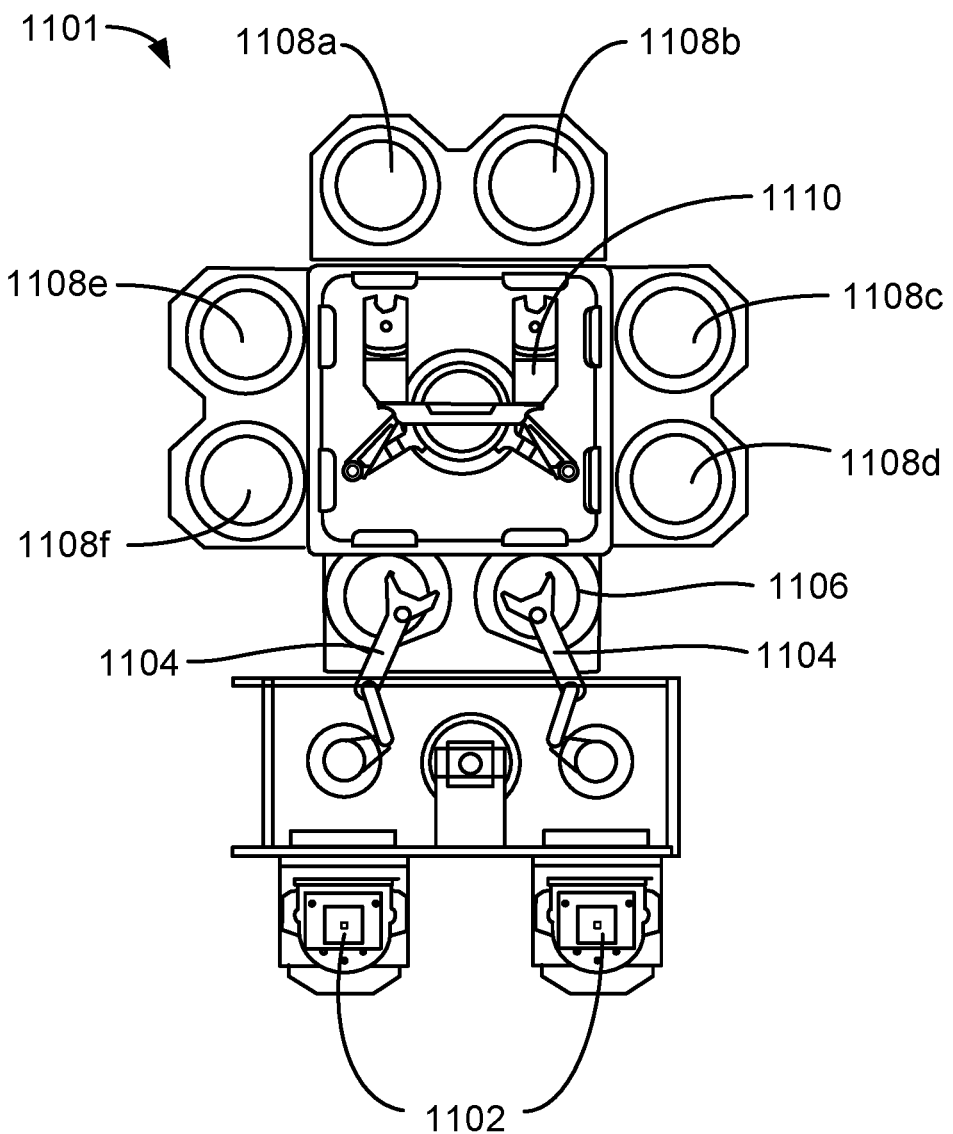
FIG. 5 shows a top view of an exemplary substrate processing system according to embodiments.

Embodiments of the substrate processing chambers may be incorporated into larger fabrication systems for producing integrated circuit chips. FIG. 4 shows one such substrate processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, atomic layer etching, pre-clean, degas, orientation, and other substrate processes.

As used herein "patterned substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "metal" of the patterned substrate is predominantly a metal element but may include minority concentrations of other elemental constituents such as nitrogen, oxygen, hydrogen, silicon and carbon. Exposed "metal" may consist of or consist essentially of a metal element. Exposed "metal nitride" of the patterned substrate is predominantly nitrogen and a metal element but may include minority concentrations of other elemental constituents such as oxygen, hydrogen, silicon and carbon. Exposed "metal nitride" may consist of or consist essentially of nitrogen and a metal element. Other examples of layers which may be processed according to methods described herein include titanium oxide, aluminum oxide, zirconium oxide, titanium-doped silicon oxide and hafnium oxide.

Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen. Exposed "silicon oxide" of the patterned substrate is predominantly $SiO_2$ but may include minority concentrations of other elemental constituents (e.g. nitrogen, hydrogen, carbon). In some embodiments, silicon oxide regions etched using the methods disclosed herein consist essentially of silicon and oxygen.

The carrier gases described herein may be inert gases. The phrase "inert gas" refers to any gas which does not form chemical bonds when etching or being incorporated into a layer. Exemplary inert gases include noble gases but may include other gases so long as no chemical bonds are formed when (typically) trace amounts are trapped in a layer.

A gap is an etched geometry having any horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. A "via" is a short gap with horizontal aspect ratio, as viewed from above, near unity. A via may appear circular, slightly oval, polygonal or slightly rectangular. A via may or may not be filled with metal to form a vertical electrical connection.

Having disclosed several embodiments, it will be recognized by those of skill in the art that various modifications, alternative constructions, and equivalents may be used without departing from the spirit of the disclosed embodiments. Additionally, a number of well known processes and elements have not been described to avoid unnecessarily obscuring the disclosed embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosed embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of forming a layer on a substrate, the method comprising:
   placing the substrate into a substrate processing region of a substrate processing chamber;

placing a liquid precursor into an aerosol generator;

flowing a carrier gas into the aerosol generator to produce aerosol droplets;

passing the aerosol droplets downward through perforations in a top electrode, through an electric field beneath the top electrode, and then towards perforations in a bottom electrode, wherein the aerosol droplets are uncharged;

applying the electric field to the aerosol droplets by applying a voltage between the top electrode and the bottom electrode;

flowing the aerosol droplets through perforations in the bottom electrode into the substrate processing region; and forming the layer on the substrate from the aerosol droplets.

2. The method of claim 1, wherein the layer is a self-assembled monolayer (SAM).

3. The method of claim 2, the self-assembled monolayer is selectively formed on exposed copper portions of the substrate but not on exposed dielectric portions of the substrate and the method further comprises forming a selectively deposited dielectric on the exposed dielectric portions but not on the exposed copper portions which are blocked by the self-assembled monolayer.

4. The method of claim 3, wherein the selectively deposited dielectric is one of silicon oxide, hafnium oxide, zirconium oxide, titanium oxide or titanium-doped silicon oxide.

5. The method of claim 1, wherein the liquid precursor includes one or more of octylphosphonic acid ($CH_3(CH_2)_6CH_2—P(O)(OH)_2$), perfluorooctylphosphonic acid ($CF_3(CF_2)_5CH_2—CH_2—P(O)(OH)_2$), octadecylphosphonic acid ($CH_3(CH_2)_{16}CH_2—P(O)(OH)_2$), decyl phosphonic acid, mesityl phosphonic acid, cyclohexyl phosphonic acid, hexyl phosphonic acid or butyl phosphonic acid.

6. The method of claim 1, wherein the layer is one of a II-VI or a III-V semiconductor.

7. The method of claim 1, wherein the layer is one of boron nitride, aluminum nitride, gallium arsenide, gallium phosphide, indium arsenide or indium antimonide.

8. The method of claim 1, wherein the layer is a metal-oxide.

9. The method of claim 1, wherein the layer consists of oxygen and a metal element.

10. The method of claim 1 wherein the electric field is a DC electric field having an electric field which points towards the substrate.

11. The method of claim 1, further comprising flowing a second precursor into the substrate processing region to form a monolayer on the layer.

12. A method of processing a layer on a substrate, the method comprising:

placing the substrate into a substrate processing region of a substrate processing chamber;

dissolving a solid precursor into a solvent to form a precursor solution within an aerosol generator;

flowing a carrier gas into the aerosol generator to produce aerosol droplets;

passing the aerosol droplets downward through perforations in a top electrode, through an electric field beneath the top electrode, and then towards perforations in a bottom electrode, wherein the aerosol droplets are uncharged;

applying the electric field to the aerosol droplets by applying a voltage between the top electrode and the bottom electrode;

flowing the aerosol droplets through perforations in the bottom electrode into the substrate processing region; and etching the layer on the substrate by chemical reaction with the aerosol droplets.

13. The method of claim 12, wherein the layer consists of two elements.

14. The method of claim 12, further comprising flowing a second precursor into the substrate processing region to remove one monolayer from the layer.

15. The method of claim 12, wherein the electric field is a DC electric field having an electric field which points towards the substrate.

16. The method of claim 12, wherein the electric field has a magnitude between 500 V/cm and 20,000 V/cm.

17. The method of claim 12, wherein the aerosol droplets have a diameter between 3 nm and 75 nm.

* * * * *